United States Patent

Castillo et al.

[11] Patent Number: 5,852,623
[45] Date of Patent: Dec. 22, 1998

[54] CERIUM ACTIVATED COLQUIRITE LASER CRYSTAL

[75] Inventors: Vida K. Castillo; Gregory J. Quarles, both of Tarpon Springs; Arlete Cassanho, Palm Harbor; Wayne R. Ignatuk, Crystal Beach, all of Fla.

[73] Assignee: VLOC, Incorporated, New Port Richey, Fla.

[21] Appl. No.: 736,158

[22] Filed: Oct. 25, 1996

Related U.S. Application Data

[60] Provisional application No. 60/005,958, Oct. 27, 1995.

[51] Int. Cl.$^6$ ....................................... H01S 3/16
[52] U.S. Cl. ................................ 372/41; 372/39
[58] Field of Search ........................ 372/39, 41

[56] References Cited

U.S. PATENT DOCUMENTS

| | | |
|---|---|---|
| 3,591,517 | 7/1971 | Van Der Ziel et al. . |
| 3,599,109 | 8/1971 | Guggenheim et al. . |
| 3,912,521 | 10/1975 | Cline et al. . |
| 3,933,572 | 1/1976 | O'Connor te al. . |
| 4,811,349 | 3/1989 | Payne et al. . |
| 5,099,490 | 3/1992 | Atherton et al. . |
| 5,105,434 | 4/1992 | Krupke et al. . |
| 5,287,373 | 2/1994 | Rapoport et al. ..................... 372/41 |
| 5,321,711 | 6/1994 | Rapoport et al. . |
| 5,487,079 | 1/1996 | Esterwitz et al. ..................... 372/42 |
| 5,517,516 | 5/1996 | Marshall et al. ..................... 372/41 |

*Primary Examiner*—Leon Scott, Jr.
*Attorney, Agent, or Firm*—Blodgett & Blodgett, P.C.

[57] ABSTRACT

A laser crystal for a solid state laser with tunable emission in the ultraviolet wavelength region. The crystal is of trivalent cerium cations activated (doped) into the colquiriite crystal structures, such as $LiCaAlF_6$ (LiCAF) and $LiSrAlF_6$ (LiSAF). The crystal is grown along a well-defined axis by seeded crystal growth techniques to provide starting material which is fabricated along the preferred polarization direction with high yields. A primary crystal growth issue for cerium activated colquiriites is the charge compensation mandated by the substitution of the trivalent cerium ion for divalent strontium, which is located in the only site large enough to support the cerium cation. Charge compensation with monovalent or divalent cations is utilized to optically stabilize the colquiriite crystal and produce a solid state laser host which is less susceptible to color center or optically-induced defect formation during the ultraviolet lasing or ultraviolet excitation mechanisms.

17 Claims, No Drawings

CERIUM ACTIVATED COLQUIRITE LASER CRYSTAL

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. F19629-94-C-0134 awarded by the Department of Defense/Air Force Material Command.

CROSS-REFERENCE TO RELATED APPLICATIONS

This is a continuing application of Provisional Application Number 60/005,958 filed on Oct. 27, 1995 (pending).

BACKGROUND OF INVENTION

The invention relates most generally to the crystal growth and charge compensation techniques of light-transmitting solid-state optical materials, more particularly to the crystal growth and charge compensation techniques of rare-earth-ion-doped solid-state laser host crystals, and most particularly to the crystal growth and charge compensation techniques of cerium-doped (activated) colquiriite crystals.

An interest in tunable solid state laser systems over the last few decades has resulted in the discovery of many laser host crystals doped with transition metal ions, including $Ti:Al_2O_3$, $Co:MgF_2$, $Cr:BeAl_2O_4$, and $Cr:LiSrAlF_6$ and its isomorphs. These crystals exhibit broad band laser emission from the red into the near-infrared portions of the spectrum due to vibronic transitions within the 3d shell. Typical transitions within the 4f shell of the trivalent rare earth ions, such as $Nd^{3+}$, $Ho^{3+}$, and $Er^{3+}$, lead to narrow-band emission in the same red to near-infrared range. The typical host crystals for these rare earth ions are $Y_3Al_5O_{12}$ and $LiYF_4$. In an effort to encompass the complete spectrum, emission in the shorter wavelength region has been sought with the 5d–4f transitions in the divalent rare earths, as well as in trivalent cerium.

The electronic configuration of the $Ce^{3+}$ ion consists of a palladium core of 46 electrons with outer electrons in the following configuration: $4f^1 5s^2 5p^6 5d^1 6s^2$. In its trivalent ionic state, the unfilled inner 4f shell is shielded by the 5s and 5p shells. There are two ground state levels in the 4f shell, which result from a spin-orbit interaction splitting. The $^2F_{7/2}$ upper level is located approximately 2000 cm$^{-1}$ above the $^2F_{5/2}$ ground state. A single electron is located in the 5d shell, 5d levels oughly 50,000 cm$^{-1}$ above the ground level (35,000 cm$^{-1}$ in oxide hosts), which is very sensitive to different crystal fields. The nature of the 5d wavefunction results in a vibrationally broadened emission spectrum, as compared to the narrow electric dipole transitions within the 4f shell. Unfortunately, if the 5d level is close to the excited 4f levels, the 5d level will depopulate and result in no broadband emission. Even if emission occurs, excited state absorption, color center formation, and solarization, all detrimental to the production of a viable solid state laser, have previously been observed in many $Ce^{3+}$-doped laser hosts, including $LiYF_4$ [Ehrlich, et al., "Ultraviolet solid-state Ce:YLF laser at 325 nm," Optics Letters 4 (6), 184–186 (1979)], $Y_3Al_5O_{12}$ [Jacobs, et al., "Measurements of excited-state-absorption loss for $Ce^{3+}$ in $Y_3Al_5O_{12}$ and implications for tunable 5d–4f rare-earth lasers," Applied Physics Letters 33 (5), 410–412 (1978)]. and $CaF_2$ [Pogatshnik, et al., "Excited-state photoionization of $Ce^{3+}$ ions in $Ce^{3+}:CaF_2$," Physical Review B 36 (16), 8251–8257 (1987)].

Tunable laser emission in the ultraviolet region is currently being achieved commercially with dye lasers and optical parametric oscillators. Unfortunately, their size, complexity, and toxicity (dyes) make them undesirable for many applications. The development of solid state lasers in this ultraviolet region would have a wide range of applications, including atmospheric remote sensing of chemical species, such as ozone.

The colquiriite family of laser host crystals includes $LiCaAlF_6$, $LiSr_{1-x}Ca_xF_6$, $LiSrAlF_6$, $LiSrGaF_6$, and other isomorphs [Viebahn, "Untersuchungen an quaternären Fluoriden $LiMe^{II}Me^{III}F_6$, Die Struktur von $LiCaAlF_6$," Zeitschrift für anorganische und allgemeine Chemie. Band 386, 335–339 (1971)]. $Cr^{3+}$-doped $LiCaAlF_6$ was first investigated and developed at Lawrence Livermore National Laboratory (LLNL) in 1988 [Payne, et al., "$LiCaAlF_6:Cr^{3+}$: A promising new solid-state laser material," IEEE Journal of Quantum Electronics 24 (11), 2243–2252 (1988)]. $Cr:LiCaAlF_6$ is a tunable laser material with a tuning range from 720 to 840 nm, similar to that of alexandrite, $Cr^{3+}:BeAl_2O_4$. $Cr^{3+}:LiSrAlF_6$, an isomorph achieved by the full substitution of strontium for calcium, exhibits absorption peaks at approximately 450 and 650 nm and a broadband stimulated emission curve spanning from 780 to 1010 nm. Both laser crystals can be efficiently pumped by a variety of techniques, due to the characteristically broad chromium absorption bands in the visible region. The longer excited state lifetimes, 67 $\mu$s for $Cr:LiSrAlF_6$, make these materials especially suitable for flashlamp pumping and energy storage when compared to $Ti^{3+}:Al_2O_3$ with its 3 $\mu$s lifetime. These chromium-doped colquiriite hosts also have low thermal lensing and do not exhibit concentration quenching. Since $Cr:LiSrAlF_6$ spans the same wavelength region as $Ti:Al_2O_3$ and has many favorable properties, it has become an undeniable competitor for $Ti:Al_2O_3$.

The success or failure of a potential laser crystal doped with any ion depends on the crystal field, the size and charge of the site designated for substitution, as well as many subtle details regarding the interaction of the impurity ion with the crystal lattice. Recently there has been a great deal of interest in the doping of fluoride crystals of the colquiriite type with the cerium ion for the production of a laser emitting in the ultraviolet region.

In 1993, the first report was made of an ultraviolet-generating gain media which lased reliably, that being Ce-doped $LiCaAlF_6$ [M. A. Dubinskii, et al. "$Ce^{3+}$-doped colquiriite. A new concept of all-solid-state tunable ultraviolet laser," Journal of Modern Optics 40, (1) 1–5 (1993); M. A. Dubinskii, et al., "Spectroscopy of a New Active Medium of a Solid State UV Laser with Broadband Single-Pass Gain," Laser Physics 3, (1) 216–217 (1993)]. In these published results, a non-oriented section of $Ce:LiCaAlF_6$ was pumped with the fourth harmonic 266 nm output of a Nd:YAG laser and was demonstrated to yield gain and to provide laser oscillation when appropriately arranged in a cavity. However, neither the effect of charge compensating cations nor the polarization of the pump source were considered (with no preferred polarization even indicated).

Several patents are relevant to the art. The host employed by Dubinskii, et al., $LiCaAlF_6$, was disclosed in U.S. Pat. No. 4,811,349, although with $Cr^{3+}$ dopants. U.S. Pat. No. 4,233,570 discusses the potential use of flashlamps to pump $Ce^{3+}$-laser materials having certain characteristics. U.S. Pat.

No. 4,132,962 discloses lasers with Ce-doped fluorides that contain a metal ion from column IIIB of the periodic table. Likewise, U.S. Pat. No. 4,083,018 describes $Ce:LiYF_4$, $Ce:LaF_3$, and other related crystals. Finally, two recent device patents have issued which described unique resonator designs which utilize Ce-activated colquiriite hosts. The first of these, U.S. Pat. No. 5,487,079, discloses a Ce:LiSAF laser device designed for a transverse-optically pumped geometry. The second recent patent, U.S. Pat. No. 5,517,516, discloses Ce-doped LiSAF and LiCAF devices which can achieve extremely high laser efficiencies through end-pumping geometries, with appropriately selected polarization coupling for optimum performance. However, neither of these most recent patents discusses crystal growth techniques, charge compensation, or defect minimization schemes. It is also worth noting that both of these patents are based upon using the Ce-activated colquiriite laser gain materials that were grown and developed by the inventors listed in this patent.

Many laser device engineers work diligently to optically pump a laser system as efficiently as possible in anticipation of maximizing the output. However, as is demonstrated in the results for this patent, one must also consider the optimization of the crystal growth process and minimization of the defects introduced during the optimized crystal growth technique. By reducing these defects, the laser engineers can then design their laser systems with fewer variable to manipulate in order to achieve the highest efficiency possible.

BRIEF SUMMARY OF THE INVENTION

Accordingly, it is an object of the invention to provide a single crystal optical matter capable of transmitting light.

It is another object of the invention to provide a single-crystal host material that may be grown via a seeded growth technique, and can be fabricated along an orientation direction which is preferable for laser operation.

It is another object of the invention to provide a single-crystal host material that may be doped with metal cations.

It is also an object of the invention to provide a solid-state laser gain medium, comprising a fluoride-based colquiriite crystal that is doped with metal cations.

It is a further object of the invention to provide a cerium and metal cation co-doped solid-state colquiriite laser crystal that exhibits superior tunable ultraviolet laser properties with minimized defects.

These and additional objects of the invention are accompanied by the structures and processes hereinafter described.

The invention comprises cerium-doped colquiriite crystals, typically to be grown through a seeded-growth technique. This class of crystal hosts can be co-doped with cerium and another metal cation for improved laser performance. The co-doping by the cations facilitates more uniform doping of the cerium activator cation into the lattice and minimizes defects which impact the tunable ultraviolet laser performance. These defects include intrinsic bulk defects (such as scatter and particulates) and light activated or induced defects (such as color centers).

BRIEF DESCRIPTION OF THE DRAWINGS

No drawings have been attached as part of this invention.

DETAILED DESCRIPTION OF THE INVENTION

The invention described herein is a solid state laser material comprising trivalent cerium cation doping of the colquiriite structure hosts, such as $LiCaAlF_6$, $LiSr_{1-x}Ca_xF_6$, $LiSrAlF_6$, $LiSrGaF_6$, and other isomorphs. In order to produce the highest efficiency ultraviolet laser output, two key components of this invention must be instituted. First, this new class of materials must be grown along a well-defined axis by seeded crystal growth techniques to provide starting material which can be fabricated along the preferred polarization direction with high yields. Growth of the colquiriite boules off-axis can cause significant problems with decreasing yields through less than efficient extraction of the laser samples. Likewise, unseeded growth can lead to sections of the boule which are randomly oriented, thus impacting (and usually diminishing) the total laser efficiency of gain media extracted from these regions [Marshall, et al., "Ultraviolet laser emission properties of $Ce^{3+}$-doped $LiSrAlF_6$ and $LiCaAlF_6$," Journal of the Optical Society of America B 11 (10), 2054–2065, (1994)]. Another primary crystal growth issue for cerium activated colquiriites is the charge compensation mandated by the substitution of the trivalent cerium ion for divalent strontium, which is located in the only site large enough to support the cerium cation. Charge compensation with monovalent or divalent cations is utilized and described herein to optically stabilize the colquiriite crystal and produce a solid state laser host which is less susceptible to color center or optically-induced defect formation during the ultraviolet lasing or ultraviolet excitation mechanisms.

The colquiriite crystals detailed herein are synthetically grown as large single crystals by utilizing known techniques such as the Czochralski method. Generally, rare earth dopant concentrations of approximately 1 atomic percent in the melt are used for the growth of the cerium-doped crystals, and more generally about 0.01 to 10 atomic percent in the melt. Crystals having a nominal diameter of 2 mm and length of approximately 18 cm have been formed, and can probably be made larger. The colquiriite crystals are made by first mixing a near-stoichiometric chemical charge with nearly equal proportions of, for example, commercially available high purity powders of LiF, $SrF_2$, $AlF_3$, with a percentage of $SrF_2$ substituted with $CeF_3$ and a percentage of $SrF_2$ or $AlF_3$ substituted with the charge compensating material (for example, the chemical for LiSAF are mixed with a 1.01:1.00:1.02 Li:SR:Al atomic % ratio). These starting materials are then melted and held at the melting point, ranging from 750° C. to 850° C. for the various colquiriite isomorphs. A seed is dipped into the melt, as prescribed by the Czochralski technique, and then rotated at the rate between 16 and 19 rpm, depending on crystal diameter, while being slowly raised at the rate of less than 1 mm/hr, generally about 0.6 mm/hr. A crystalline boule thereby slowly emerges from the melt, and most of the boule is found to consist of clear single crystal material, with minimal cracks, smoke, or other forms of optical defects. Crystals grown utilizing these growth parameters typically exhibited passive losses of less than 0.1%/cm, which is adequate for most laser applications.

To understand the requirements for proper crystal growth and charge compensation one must understand the crystal lattice structure and ion charge balance requirements. The crystal lattice of the colquiriites belongs to the space group $D^2_{3d}$ with two formula units per unit cell and is derived from the $Li_2ZrF_6$ structure [Schaffers, et al., "Structure of $LiSrAlF_6$," Acta Crystallographica C47, 18–20 (1991)]. The trigonal colquiriite structure is such that each metal ion site is unique in size and charge. Surrounded by fluorine ions, each of the three metal ions are located in distorted octahedral sites, with a $D_3$ site symmetry between planes of close-packed fluorine anions. These metal cations all differ both in size and in charge. The cerium activator ion carries a 3+ charge, is 1.15 Å in ionic radius, and has a 4f$^1$ electron configuration. The size of the Ce$^{3+}$ ionic radius would lead one skilled in the art to presume that rare earth ion dopants, such as Ce$^{3+}$, would preferentially substitute into the M$^{II}$ divalent (Sr$^{2+}$/Ca$^{2+}$) sites (1.27 Å/1.14 Å), rather than the 0.67 Å Al$^{3+}$ site. The lithium site has a prohibitively large mismatch in both charge (a 1+ charge) and in ionic radius and size (0.73 Å). Even though the divalent sites are sufficiently large to accommodate the trivalent cerium ion, there is a charge imbalance which demands that compensation be present somewhere else in the lattice to maintain charge neutrality.

Charge compensation can be achieved by physically adding an impurity ion with a different charge designated to substitute into a particular site by its size. There are two particular types of compensation techniques that are addressed in the claims of this patent. The first technique involves the use of monovalent cations (such as Na$^{1+}$) on a divalent site (such as Sr$^{2+}$) so that the extra 1+ charge existing from the Ce$^{3+}$ ion on the divalent site is compensated for by the reduced 1+ charge on a nearby divalent site. The second technique involves the use of divalent cations (such as Mg$^{2+}$) on a trivalent site (such as Al$^{3+}$) so that the extra 1+ charge existing from the Ce$^{3+}$ ion on the divalent site is compensated for by the reduced 1+ charge on a nearby trivalent site. If this charge imbalance is not corrected, anions (such as F$^+$) can become trapped as defects of interstitial anions and produce coloring or darkening of the crystals when illuminated with ultraviolet photons. This will ultimately raise the threshold of these crystals during laser operation, reduce the laser output efficiency, and decrease the available laser tuning region.

Charge compensation with Na$^{1+}$, or other monovalent cations, by substitution into the Sr$^{2+}$-type divalent site (1.27 Å) is perhaps the most logical charge compensation step in order to achieve a higher or more uniform cerium concentration in the crystal, and to minimize the charge imbalance defects. An ionic radius of 1.16 Å should allow sodium to easily substitute into the strontium site to compensate for the excess positive charge in the lattice, resulting from the Ce$^{3+}$ incorporation into the Sr$^{2+}$ site. The other monovalent charge compensation cations are somewhat larger in ionic radii (1.52, 1.63, and 1.84 Å for K$^{1+}$, Rb$^{1+}$ and Cs$^{1+}$, respectively), thus reducing their overall effect as compensators as their radius mismatch increases. The cerium distribution should be nearly uniform from the top to the bottom of boules compensated with the Na$^{1+}$ cation.

The selection process for an appropriate divalent compensator is complicated by the fact that this divalent ion must be small enough to fit into the 0.67 Å aluminum site to avoid an undesired substitution directly into the strontium-type site (1.27 Å). Magnesium is a potential charge compensating divalent ion for substitution into the Al$^{3+}$ site. Mg$^{2+}$ is electronegative and ionic, however, with an ionic radius of 0.86 Å, which would not make this ion 100% effective, primarily because it would have to enter the aluminum site with nearly a 30% size mismatch. Another divalent cation, Zn$^{2+}$, could also be utilized as the compensating ion, intended for substitution into the Al$^{3+}$ site. Zinc is more covalent than magnesium and less electronegative, making it more similar to aluminum. Although the nature of the site may be more suitable for Zn$^{2+}$, the 0.89 Å ionic radius of zinc may cause the intended charge balancing to also be less than 100% effective. Other divalent cations that could potentially assist in offsetting any charge imbalance include Ba$^{2+}$, Be$^{2+}$, and Cd$^{2+}$.

Changes and modifications in the specifically described embodiments can be carried out without departure from the scope of the invention which is intended to be limited only by the scope of the appended claims.

What is claimed is:

1. A laser crystal of the composition M$^I$M$^{II}$M$^{III}$F$_6$, wherein each of said M$^I$ sites contains a monovalent cation selected from the group consisting of: Li$^{1+}$, Na$^{1+}$, K$^{1+}$, Rb$^{1+}$, and C$_S^{1+}$, C$^{1+}$, at least one of said M$^{II}$ sites contains a divalent cation selected from the group consistent of: Be$^{2+}$, Mg$^{2+}$, Ca$^{2+}$, Sr$^{2+}$, Cd$^{2+}$, and Ba$^{2+}$, at least one said M$^{III}$ sites containing a trivalent cation selected from the group consisting of: B$^{3+}$, Al$^{3+}$, Ga$^{3+}$, Sc$^{3+}$, and In$^{3+}$, and wherein said laser crystal is doped with trivalent cerium cations and charge compensating ions selected from the group consisting of: Na$^{1+}$, K$^{1+}$, Mg$^{2+}$, Ba$^{2+}$, Be$^{2+}$, Cd$^{2+}$, and Zn$^{2+}$ so that at least one of said M$^{II}$ sites contains Ce$^{3+}$, and one of said M$^{II}$ and M$^{III}$ sites adjacent to each M$^{II}$ site which contains a Ce$^{3+}$ cation contains one of said charge compensating ions.

2. A laser crystal of the composition M$^I$M$^{II}$M$^{III}$F$_6$, wherein each of said M$^I$ sites contains a monovalent cation selected from the group consisting of: Li$^{1+}$, Na$^{1+}$, K$^{1+}$, Rb$^{1+}$, and C$^{1+}$, at least one of said M$^{II}$ sites contains a divalent cation selected from the group consisting of: Mg$^{2+}$, Ca$^{2+}$, Sr$^{2+}$, Cd$^{2+}$, and Ba$^{2+}$ and at least one of said M$^{III}$ sites contains a trivalent cation selected from the group consisting of: B$^{3+}$, Al$^{3+}$, Ga$^{3+}$, Sc$^{3+}$, and In$^{3+}$, and wherein said laser crystal is doped with trivalent cerium cations and charge compensating ions selected from the group consisting of: Na$^{1+}$, K$^{1+}$, so that at least one of said M$^{II}$ sites contains Ce$^{3+}$, and one of said M$^{II}$ sites adjacent each M$^{II}$ site which contains a Ce$^{3+}$ cation contains one of said charge compensating ions.

3. A laser crystal of the composition M$^I$M$^{II}$M$^{III}$F$_6$, wherein each of said M$^I$ sites contains a monovalent cation selected from the group consisting of: Li$^{1+}$, Na$^{1+}$, K$^{1+}$, Rb$^{1+}$, and C$^{1+}$, at least one of said M$^{II}$ sites contains a divalent cation selected from the group consisting of: Mg$^{2+}$, Ca$^{2+}$, Sr$^{2+}$, Cd$^{2+}$, and Ba$^{2+}$ and at least one of said M$^{III}$ sites contains a trivalent cation selected from the group consisting of: B$^{3+}$, Al$^{3+}$, Ga$^{3+}$, Sc$^{3+}$, and In$^{3+}$, and, wherein said laser crystal is doped with trivalent cerium cations and charge compensating ions selected from the group consisting of: Mg$^{2+}$, Be$^{2+}$, Cd$^{2+}$, and Zn$^{2+}$ so that at least one of said M$^{II}$ sites contains Ce$^{3+}$, and one of said M$^{III}$ sites adjacent each M$^{II}$ site which contains a Ce$^{3+}$ cation contains one of said charge compensating ions.

4. A laser crystal of the composition M$^I$M$^{II}$M$^{III}$F$_6$, wherein each of said M$^I$ sites contains a monovalent cation selected from the group consisting of: Li$^{1+}$, Na$^{1+}$, K$^{1+}$, Rb$^{1+}$, and C$^{1+}$, at least one of said M$^{II}$ sites contains a divalent cation selected from the group consisting of: Be$^{2+}$, Mg$^{2+}$, Ca$^{2+}$, Sr$^{2+}$, Cd$^{2+}$, and Ba$^{2+}$ and at least one of said M$^{III}$ sites contains a trivalent cation selected from the group consisting of: B$^{3+}$, Al$^{3+}$, Ga$^{3+}$, Sc$^{3+}$, and In$^{3+}$, and where at least one of said M$^{II}$ sites contains a trivalent cerium cation, and one of said M$^{II}$ and M$^{III}$ sites adjacent each M$^{II}$ site which contain a Ce$^{3+}$ cation contains a charge compensating ion selected from the group consisting of: Na$^{1+}$, K$^{1+}$, Mg$^{2+}$, Be$^{2+}$, Cd$^{2+}$, and Zn$^{2+}$.

5. A laser crystal as recited in claim 4, wherein said crystal has a trigonal colquiriite lattice structure comprised of formula unit cells having a space group D$^2_{3d}$ with two formula units per unit cell.

6. A laser crystal as recited in claim 5, wherein each of said M$^I$, M$^{II}$, and M$^{III}$ ions is surrounded by fluorine anions in distorted octahedral sites.

7. A laser crystal as recited in claim 4, wherein said monovalent cation is $Li^{1+}$, said divalent cation is $Sr^{2+}$, said trivalent cation is $Al^{3+}$ with an atomic percentage of $Sr^{2+}$ substituted with $Ce^{3+}$ and an atomic percentage of at least one of said $Sr^{2+}$ and $Al^{3+}$ being substituted with at least one of said charge compensating ions, the atomic percentage of said charge compensating ions being equal to the atomic percentage of said $Ce^{3+}$.

8. A laser crystal as recited in claim 7, wherein the atomic percentage of each of said $Ce^{3+}$ and said charge compensating ions is from 0.01 to 10 atomic percent.

9. A method of growing a laser crystal of the composition $M'M''M'''F_6$ comprising the following steps:
   (a) providing a quantity of a first compound selected from the group LiF, NaF, KF, RbF, and CsF;
   (b) providing a quantity of a second compound selected from the group: $BeF^2$, $MgF_2$, $CaF_2$, $SrF_2$, $CdF_2$, and $BaF_2$;
   (c) providing a quantity of a third compound selected from the group: $BF^3$, $AlF_3$, $GaF_3$, $ScF_3$, and $InF_3$;
   (d) providing a quantity of a fourth compound of $CeF_3$;
   (e) providing a quantity of a fifth charge compensating compound selected from the group: NaF and KF;
   (f) forming a primary mixture by mixing substantially equal atomic unit amounts of said first compound, said third compound and a sub mixture of said second, fourth and fifth compounds, each of the fourth and fifth compounds in said sub mixture being in substantially equal atomic amounts of from 0.01 to 10 atomic percent of said primary mixture with the remainder of said sub mixture being said second compound;
   (g) melting said primary mixture and said sub-mixture to form a melt mass;
   (h) immersing a seed crystal into said melt mass; and
   (i) rotating and simultaneously raising said seed crystal within said melt mass to form a crystalline boule.

10. A method of growing a laser crystal as recited in claim 9, wherein said melt mass is maintained at a temperature ranging from 750° C. to 850° C.

11. A method of growing a laser crystal as recited in claim 9, wherein said seed crystal is rotated at the rate from 16 rpm to 19 rpm.

12. A method of growing a laser crystal as recited in claim 9, wherein said seed crystal is raised at the rate of less than 1 mm/hr.

13. A method of growing a laser crystal of the composition $M'M''M'''F_6$ comprising the following steps:
   (a) providing a quantity of a first compound selected from the group LiF, NaF, KF, RbF, and CF;
   (b) providing a quantity of a second compound selected from the group: $BeF^2$, $MgF_2$, $CaF_2$, $SrF_2$, $CdF_2$, and $BaF_2$;
   (c) providing a quantity of a third compound selected from the group: $BF^3$, $AlF_3$, $GaF_3$, $ScF_3$, and $InF_3$;
   (d) providing a quantity of a fourth compound of $CeF_3$;
   (e) providing a quantity of a fifth charge compensating compound selected from the group: NaF, KF, $MgF_2$, $BeF_2$, $CdF_2$, and $ZnF_2$;
   (f) forming a mixture of substantially equal atomic unit amounts of said first, second and third compounds, and adding sufficient substantially equal atomic unit amounts of said fourth and fifth compounds to said mixture so that said combined second, third, fourth and fifth compounds have substantially double the atomic unit amounts of said first compound;
   (g) meting said mixture to form a melt mass;
   (h) immersing a seed crystal into said melt mass; and
   (i) rotating and simultaneously raising said seed crystal within said melt mass to form a crystalline boule.

14. A method of growing a laser crystal as recited in claim 13, wherein the atomic percentage of each of said fourth and fifth compounds is from 0.01 to 10 percent of said mixture.

15. A method of growing a laser crystal as recited in claim 13, wherein said melt mass is maintained at a temperature ranging from 750° C. to 850° C.

16. A method of growing a laser crystal as recited in claim 13, wherein said seed crystal is rotated at the rate from 16 rpm to 19 rpm.

17. A method of growing a laser crystal as recited in claim 13, wherein said seed crystal is raised at the rate of less than 1 mm/hr.

* * * * *